United States Patent [19]

Koo et al.

[11] Patent Number: 4,603,296

[45] Date of Patent: Jul. 29, 1986

[54] FIBER OPTIC DC MAGNETOMETER WITHOUT HYSTERESIS AMBIGUITY

[75] Inventors: Kee P. Koo, Alexandria; George H. Sigel, Jr., Great Falls, both of Va.

[73] Assignee: The United States of America as represented by the Secretary of the Navy, Washington, D.C.

[21] Appl. No.: 610,460

[22] Filed: May 15, 1984

[51] Int. Cl.$^4$ ............... G01R 33/032; G01B 9/02; G02F 1/29
[52] U.S. Cl. ............... 324/244; 250/227; 350/375; 324/96; 356/345
[58] Field of Search ............... 324/244, 249, 260–262, 324/96; 350/96.15, 96.29, 375, 374; 356/345; 250/227, 231 R

[56] References Cited

U.S. PATENT DOCUMENTS

| | | | |
|---|---|---|---|
| 4,147,979 | 4/1979 | Baues et al. | 324/244 |
| 4,264,126 | 4/1981 | Sheem | 350/96.15 |
| 4,376,248 | 3/1983 | Giallorenzi et al. | |
| 4,378,497 | 3/1983 | Giallorenzi | |
| 4,433,291 | 2/1984 | Yariv et al. | |
| 4,471,219 | 9/1984 | Giallorenzi | 324/244 X |
| 4,529,876 | 7/1985 | Walker | 250/227 |

FOREIGN PATENT DOCUMENTS 2014291 7/1971 Fed. Rep. of Germany ........ 324/96

OTHER PUBLICATIONS

Rashleigh, "Magnetic-Field Sensing With a Single-Mode Fiber", *Optics Letters*, vol. 6, No. 1, Jan. 1981, pp. 19–21.
Yariv et al, "Proposal for Detection of Magnetic Fields Through Magnetostrictive Perturbation of Optical Fibers", *Optics Letters*, vol. 5, No. 3, Mar. 1980, pp. 87–89.
Dandridge, et al. (Electronics Letters) "Optical Fibre Magnetic Field Sensors", #16, pp. 408–409 (1980).
Koo, et al. (Optics Letters) "Characteristics of Fiber-Optic Magnetic-Field Sensors Employing Metallic Glasses", pp. 334–336 (Jul. 1982) vol. 7, No. 7.
Koo, et al. (Fourth International Conference on Integrated Optics and Optical Fiber Communications) Technical Digest, Tokyo, Japan, Jun. 27–30, 1983.
Koo et al., "A Fiber-Optic DC Magnetometer", *Journal of Lightwave Technology*, vol. LT-1, No. 3, Sep. 1983, pp. 524–525.

*Primary Examiner*—Gerard R. Strecker
*Assistant Examiner*—Warren S. Edmonds
*Attorney, Agent, or Firm*—Robert F. Beers; Sol Sheinbein; William R. Sharp

[57] ABSTRACT

A fiber optic magnetometer for detecting DC magnetic fields includes a first optical fiber having a magnetostrictive jacket thereon which defines a sensing arm, and a second fiber defining a reference arm. A first AC magnetic field of frequency $\omega_o$ and a second AC field of frequency $\omega_s$ are imposed on the magnetostrictive jacket so as to cause a time varying optical path length change, having $\omega_o$, $(\omega_o+\omega_s)$, and $(\omega_o-\omega_s)$ components in the sensing arm fiber. This induces a corresponding time varying phase shift, also having the above components, in light transmitted through the sensing arm fiber which is detected by a phase detector. The phase detector produces a signal proportional to the phase shift, this signal being passed to a lock-in amplifier set to amplify at $\omega_o$. $\omega_s$ is sufficiently small such that the lock-in amplifier filters all components other than the $\omega_o$, $(\omega_o+\omega_s)$, and $(\omega_o-\omega_s)$ components. The sum of these components changes in magnitude upon exposure of the magnetostrictive jacket to a DC field, thereby indicating the presence of a DC field. The lock-in amplifier output is plotted on an oscilloscope versus the second AC field of frequency $\omega_s$ to give a loop which shifts in position when the device is exposed to an external DC field.

10 Claims, 3 Drawing Figures

FIBER OPTIC DC MAGNETOMETER WITHOUT HYSTERESIS AMBIGUITY

BACKGROUND OF THE INVENTION

This invention relates to magnetometers, and more particularly to magnetometers of the fiber optic type.

Sensing of magnetic fields using fiber optic interferometers has been demonstrated recently. These devices may be used to detect the presence of objects that produce DC magnetic fields. In these devices, a two-arm Mach-Zehnder fiber interferometer is used wherein one of the fiber optic interferometer arms serves as a sensor arm on which some magnetostrictive material is deposited. When exposed to a magnetic field, the magnetostrictive material will stretch the sensor fiber while the reference fiber remains unaffected. As a result, a magnetically induced differential path length change or phase shift is introduced at the output of the interferometer.

In practice, all ferromagnetic materials exhibit hysteresis behavior to some extent, implying that the performance of the material depends on the magnetic history that the sample has been subjected to. In other words, once the magnetostrictive sensor is exposed to an external magnetic field, removal of the magnetic field will leave a residual material magnetization or sensor signal whose strength depends on the last largest magnetic field applied to the magnetic sample. As a result, any subsequent sensor output is a measure of the applied external magnetic field plus the residual magnetization of the magnetic material. Since the residual magnetization due to magnetic hysteresis is magnetic history dependent, the applied magnetic field measurement is undetermined or ambiguous without knowing the magnetic history or hysteresis of the magnetic material. In order to determine the true strength of an external magnetic field without ambiguity introduced by any material hysteretic effect, some corrective measure is needed.

SUMMARY OF THE INVENTION

It is, therefore, an object of the present invention to provide a fiber optic magnetometer which will measure magnetic fields without ambiguity due to material magnetic hysteresis.

The above object is realized in a fiber optic magnetometer which employs two AC magnetic fields of different frequencies imposed on a sensing arm. The magnetometer of the present invention includes a length of optical fiber having an optical length L in an unstrained condition, and a magnetostrictive element closely associated with the fiber which undergoes a dimensional change in the presence of a magnetic field. This dimensional change results in a strain imposed on the fiber which causes a change in the fiber's optical length, $\Delta L$. An AC magnetic field source is provided for generating a first AC field having a frequency $\omega_o$ and a second AC field having a frequency $\omega_s$ in the vicinity of the magnetostrictive element so as to cause a time varying $\Delta L$. $\Delta L$ is the sum of several frequency components, including an $\omega_o$ component, an $(\omega_o+\omega_s)$ component, and a $(\omega_o-\omega_s)$ component. Finally, a detection means is provided for detecting the sum of the $\omega_o$, $(\omega_o+\omega_s)$, and $(\omega_o-\omega_s)$ components. The sum of these components changes in magnitude upon exposure of the magnetostrictive element to a DC field, thereby indicating the presence of a DC field.

The magnetometer of the present invention is capable of detecting and measuring DC fields without hysteretic ambiguity. That is, even if some residual magnetization is present in the magnetostrictive element, the present magnetometer will given an accurate measurement of DC fields to which the device is exposed.

DESCRIPTION OF THE PREFERRED EMBODMENTS

A fiber optic magnetometer for the detection of DC magnetic fields is described herein which utilizes AC magnetic fields of two frequencies imposed on a sensing arm.

Figure 1:
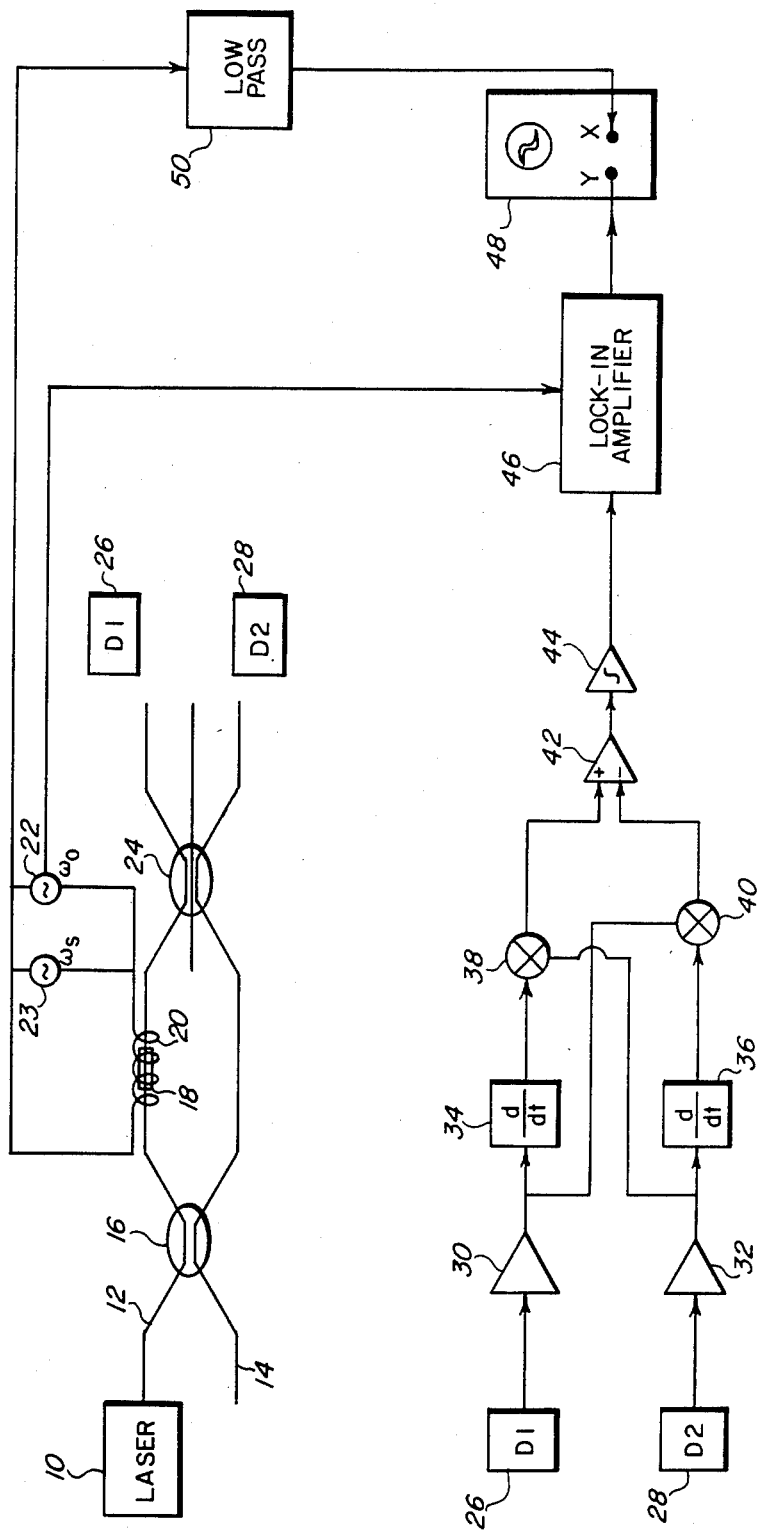
FIG. 1 is a schematic illustration of one embodiment of the present invention.

Referring now to FIG. 1, a schematic illustration of one embodiment of the present invention is shown. Laser 10 is provided to transmit a beam through optical fiber 12. As shown, a second fiber 14 is also provided. Both fibers 12 and 14 are coupled into a 2×2 bottle coupler 16 which functions to divide the input beam from fiber 12 into two beams by evanescent field coupling. Reference may be made to U.S. Pat. No. 4,264,126, whose disclosure is herein incorporated by reference, for a description of this type of field coupling. Thus, coherent light of the same magnitude and wavelength is caused to propagate through each fiber.

Fiber 12 is received inside a magnetostrictive jacket 18 which may be made of a magnetostrictive material such as nickel. Typically, the jacket is bonded to fiber 12 with an epoxy resin. Upon exposure to a magnetic field, the longitudinal dimension of jacket 18 is altered, transmitting a strain to fiber 12. Consequently, the optical path length of light passing through fiber 12 is changed so as to induce a phase shift in the light. Fiber 14 does not have its optical length changed, such that light passing through it does not experience a phase shift.

As shown, a coil 20 is situated in proximity to jacket 18 so as to be coaxially positioned with respect to jacket 18. Coil 20 is supplied with an AC current having a frequency $\omega_o$ by an oscillator 22. The frequency $\omega_o$ may be from about 10 Hz to about 1 KHz. It is not desirable to operate the device at a frequency $\omega_o$ below 10 Hz, since in this frequency range various perturbations occur which destroy device accuracy. To obtain the best results, a frequency $\omega_o$ above 500 Hz should be used.

Additionally, oscillator 23 is provided to supply an AC current having a frequency $\omega_s$ to coil 20. The frequency $\omega_s$ should be different than $\omega_o$ to be in accordance with the present invention. Also, the waveform $\omega_o$ generated is preferably sawtooth, as will be explained below. A sinusoidal wave can also be employed however. In this particular embodiment, due to the electronics used as are later described, $\omega_s$ should be substantially smaller than $\omega_o$. The reason for this relationship between the two frequencies will be explained below in conjunction with the description of the electronic components. Typical values for $\omega_s$ range from about 0.01 Hz to 10 Hz. Furthermore, the amplitude of the waveform generated by oscillator 23 should preferably be of a magnitude such that the magnetic field generated by coil 20 due to the current from oscillator 23, $H_s \cos \omega_s t$, is larger than the magnetic fields one wants to measure.

Thus, coil 20 acts to generate an AC magnetic field of frequency $\omega_o$ and an AC field of frequency $\omega_s$ in the vicinity of the magnetostrictive jacket 18 so as to cause time varying dimensional changes in the jacket 18.

Fibers 12 and 14 are each coupled into a 3×3 bottle coupler 24 which will give two outputs A sin $\theta$ and B sin $\theta$ (i.e., $\pi/2$ phase difference). Here, A and B are constants depending on the power splitting ratio of the coupler 24 and $\theta$ is the phase shift induced in light transmitted thorugh fiber 12. These outputs are fed into photodetectors 26 and 8, labeled D1 and D2 respectively, which detect light incident thereon in a conventional manner.

Here, fiber 12 defines a sensing arm between the couplers, and fiber 14 defines a reference arm between the couplers. Typically, the path length difference between the sensing arm and the reference arm is shorter than the coherence length of laser 10. For ultimate performance, the arms are equal in length.

As shown, the outputs from detectors 26 and 28 are coupled into amplifiers 30 and 32 respectively. Amplifiers 30 and 32 amplify the received signals, and produce amplified output signals which are fed into differentiators 34 and 36, each of which are labeled d/dt in FIG. 1. Multiplier 38 receives an output signal from amplifier 32 and differentiator 34, and multiplier 40 receives an output from amplifier 30 and differentiator 36. Multipliers 38 and 40 multiply their respective inputs in a manner well known in the art, and generate outputs which are received by differential amplifier 42. Differential amplifier 42 generates a signal proportional to the difference of its inputs, this signal being coupled into integrator 44, whose output is received by lock-in amplifier 46. The output of integrator 44, as will be shown hereinafter is proportional to the above-mentioned phase shift $\theta$. As shown, lock in amplifier 46 receives a reference signal at frequency $\omega_o$ from oscillator 22, such that the lock-in amplifier acts to amplify at $\omega_o$.

Any lock-in amplifier has a Q (quality) factor which may be set by adjusting the time constant. This capability for adjustment is a conventional feature in most commercially available lock-in amplifiers. The Q factor determines how well the amplifier filters out frequencies close to the reference frequency, which in this case is $\omega_o$. The lower the Q factor, the wider a range of frequencies which the lock-in amplifier will pass. In the illustrated embodiment, lock-in amplifier 46 is set to have a Q factor such that it will pass not only $\omega_o$ input components, but also $(\omega_o + \omega_s)$ and $(\omega_o - \omega_s)$ components. Stated another way, $\omega_s$ must be sufficiently small so that the lock-in amplifier will detect an $(\omega_s + \omega_s)$ or an $(\omega_o - \omega_s)$ input frequency component as an $\omega_o$ component so as to produce an output signal having $(\omega_o + \omega_s)$ and $(\omega_o - \omega_s)$ components as well as an $\omega_o$ component. The reasons for the above features will become apparent from the description of device operation.

Such a lock-in amplifier as described above is commercially available from EG&G Corporation of Princeton, N.J. One suitable lock in amplifier model is model no. 5204.

The output of lock-in amplifier 46 is coupled into an input, in this case the Y input, of an oscilloscope 48. As shown, oscillators 22 and 23 are connected to a low pass filter 50 which functions to pass only the lower frequency signal ($\omega_s$) from oscillator 23. This output from low pass filter 50 is received by the X input of oscillator 48. Thus, oscilloscope 48 displays on an orthogonal axis system the lock-in amplifier output as a function of $H_s \cos \omega_s t$, since $H_s \cos \omega_s t$ is proportional to the AC current signal from $\omega_s$ oscillator 23, where $H_s \cos \omega_s t$ is the magnetic field caused to be generated by oscillator 23.

The above described apparatus operates to detect DC magnetic fields as follows.

In operation, the magnetometer illustrated in FIG. 1 operates to detect DC fields as follows. A laser beam from laser 10 is split by bottle coupler 16 into two coherent beams, as discussed above, which are transmitted through fibers 12 and 14. The AC magnetic fields generated by coil 20 causes a dimensional change in jacket 18, thereby imposing a longitudinal strain on fiber 12. Thus, the AC magnetic field acts to produce a time varying change in optical length of fiber 12, so as to also cause a time varying phase shift $\theta$ to be induced in the light transmitted through fiber 12.

$\Delta L$, which is the differential path length change from a length L of fiber 12 in an unstrained condition, is given by $$\Delta L = L C_n H^{2n}, \tag{1}$$

where $C_n$ is the magnetostrictive constant and H is the magnetic field strength. (1) may also be written as $$\Delta L = K_n H^{2n} \tag{2}$$

The total magnetic field may be written as $$H = H_{DC} + H_s \cos \omega_s t + H_o \cos \omega_o t, \tag{3}$$

where $H_{DC}$ is a DC magnetic field to which magnetostrictive jacket 18 is exposed, $H_s \cos \omega_s t$ is the AC field caused to be generated by oscillator 23, and $H_o \cos \omega_o t$ is the AC field caused to be generated by oscillator 22. For the sake of simplicity, oscillator 23 has been assumed to generate a sinusoidal waveform. However, a sawtooth wave is preferable, but not essential, in order to have a linear scale on the oscilloscope display. For the purpose of illustration, let n=1 so that $$\begin{aligned}\Delta L = &\, K_1 H_{DC}^2 + K_1 H_s^2 \cos^2 \omega_s t + K_1 H_o^2 \cos^2 \omega_o t + \\ &\, K_1 H_{DC} H_s \cos \omega_s t + K_1 H_{DC} H_o \cos \omega_o t + \\ &\, K_1 H_s H_o \cos \omega_s t \cos \omega_o t.\end{aligned} \tag{4}$$

In view of the identities $$\cos^2 \omega_s t = \tfrac{1}{2}[1 + \cos 2\omega_s t] \text{ and} \tag{5}$$

$$\cos \omega_s t \cos \omega_o t = \tfrac{1}{2}[\cos(\omega_o + \omega_s) t + \cos(\omega_o - \omega_s) t], \tag{6}$$

then the differential path length may be rewritten as follows:

$$\begin{aligned}\Delta L = &\, K_1 H_{DC}^2 + K_1 H_s^2/2 + K_1 H_o^2/2 + \\ &\, K_1 H_{DC} H_s \cos \omega_s t + K_1 H_{DC} H_o \cos \omega_o t + \\ &\, (K_1 H_s^2/2)(\cos 2\omega_s t) + (K_1 H_o^2/2)(\cos 2\omega_o t) + \\ &\, [K_1 H_s H_o/2][\cos(\omega_o + \omega_s) t + \cos(\omega_o - \omega_s) t].\end{aligned} \tag{7}$$

Light from both fibers 12 and 14 is coupled into 3×3 bottle coupler 24. The light beams from each fiber combine with each other in coupler 24 to give outputs A sin θ and B cos θ. For purposes of illustration, it will be assumed that the output conducted by fiber 12 to detector 26 is A sin θ, and that the output from fiber 14 to detector 28 is B cos θ. As can be seen from FIG. 1, one output from 3×3 coupler 24 is not being used in the present device.

The above mentioned outputs are detected, and signals from detectors 26 and 28 are amplified by amplifiers 30 and 32. For the sake of simplicity, the constants A and B will be assumed to remain the same. Thus, signals A sin θ and B cos θ are fed into differentiators 34 and 36, respectively. Differentiator 34 produces an output signal A cos θ (dθ/dt), and differentiator 36 generates and output signal −B sin θ (dθ/dt). These differentiator output signals are simply the derivatives of A sin θ and B cos θ. The amplifier outputs are also fed into multipliers 38 and 40, such that each multiplier multiplies its two inputs. Therefore, multiplier 38 performs the function (B cos θ) (A cos θ (dθ/dt)) to yield AB cos²θ(dθ/dt). Similarly, multiplier 40 performs the function (A sin θ)·(−B sin θ(dθ/dt) to yield −AB sin²θ(dθ/dt). Differential amplifier 42 receives the above output signals from the multipliers so as to subtract one from the other to give an output $$AB \cos^2\theta \frac{d\theta}{dt} + AB \sin^2\theta \frac{d\theta}{dt} = \qquad (8)$$

$$AB \frac{d\theta}{dt}(\cos^2\theta + \sin^2\theta) =$$

$$AB \frac{d\theta}{dt}.$$

Integrator 44 integrates this, producing an output E as follows:

$$E = AB \int \frac{d\theta}{dt} dt \qquad (9)$$
$$= AB\theta$$
$$= M\theta$$

Thus, the output signal E is proportional to the phase shift θ.

The phase shift can be expressed as $$\theta = 2\pi \Delta L / 2 \qquad (10)$$

Therefore, the phase shift is proportional to ΔL since λ is a constant.

Combining the equations (9) and (10), it can be seen that output E is proportional ΔL. Thus, from (7), E can be expressed as $$E = JH_{DC}^2 + JH_s^2/2 + JH_o^2/2 + \qquad (11)$$
$$JH_{DC}H_s \cos \omega_s t + JH_{DC}H_o \cos \omega_o t +$$
$$(JH_s^2/2)(\cos 2\omega_s t) + (JH_o^2/2)(\cos 2\omega_o t) +$$
$$[JH_sH_o/2] [\cos (\omega_o + \omega_s)t + \cos(\omega_o - \omega_s)t],$$

where J is a constant. Thus, E, as well as θ and ΔL, have several frequency components which include an $\omega_o$ component $JH_{DC} H_o \cos \omega_o t$, an $(\omega_o + \omega_s)$ component $[JH_sH_o/2][\cos(\omega_o+\omega_s)t]$, and an $(\omega_o - \omega_s)$ component $JH_sH_o/2 [\cos(\omega_o - \omega_s)t]$.

Lock-in amplifier 46 receives a reference signal at $\omega_o$ is thus set to amplify at $\omega_o$. As noted above, however, $\omega_s$ is sufficiently small such that lock-in amplifier 46 detects $(\omega_o + \omega_s)$ and $(\omega_o - \omega_s)$ components as well as the $\omega_o$ component. The sum of these three components is:

$$JH_{DC}H_o \cos \omega_o t + [JH_sH_o/2][\cos(\omega_o+\omega_s)t + \cos(\omega_o-\omega_s)t]. \qquad (12)$$

Equation (12) may be rewritten as $$JH_{DC}H_o \cos \omega_o t + [JH_sH_o/2] [\cos \omega_o t \cos \omega_s t - \qquad (13)$$
$$\sin \omega_o t \sin \omega_s t + \cos \omega_o t \cos \omega_s t + \sin \omega_o t \sin \omega_s t],$$

or $$JH_o \cos \omega_o t [H_{DC} + H_s \cos \omega_s t]. \qquad (14)$$

As can be seen from equation (14), the sum of the $\omega_o$, $(\omega_o+\omega_s)$, and $(\omega_o-\omega_s)$ components changes in magnitude upon device exposure to a DC field ($H_{DC}$). The illustrated apparatus is adapted to reflect this change in magnitude, which is indicative of the presence of a DC field, as will be explained below.

The lock-in amplifiers as described above operate by a phase sensitive detection (PSD) scheme, which may be operated in an amplitude mode or a phase mode. In all cases, lock-in amplifier 46 mixes the input signal as expressed in equation (11) with the reference signal from oscillator 22 A cos($\omega_o t + \phi$), where $\phi$ is the relative phase between the input and reference signals. The mixed signal is then filtered through a low-pass filter within lock-in amplifier 46 in a conventional manner. Consequently, in the PSD scheme, lock in amplifier 46 produces an output $Y_{PSD}$ as follows:

$$Y_{PSD} = CAH_o[H_{DC} + H_s \cos \omega_s t] \cos \phi, \qquad (15)$$

which is proportional to the sum of the $\omega_o$, $(\omega_o+\omega_s)$; and $(\omega_o-\omega_s)$ components. The illustrated embodiment utilizes the amplitude and phase mode outputs, as described below, which are subsets of the PSD output.

In the amplitude mode, lock in amplifier 46 produces an output $Y_A$ as follows:

$$Y_A = CAH_o|[H_{DC}+H_s \cos \omega_s t]|. \qquad (16)$$

In the phase mode, the lock in amplifier 46 produces an output $$Y_p = B\phi \qquad (17)$$

where B is a constant. For the system described here, $\phi$ has the following characteristics:

$$\phi = \begin{cases} 0, & H > 0 \\ \pi, & H < 0 \end{cases} \qquad (18)$$

where H is the total magnetic field. This arises from the quadratic magnetostrictive response of the magnetostrictive jacket 18 and the above described AC modulation.

In either the phase or amplitude mode, the lock-in amplifier output is fed into the Y (vertical axis) input of oscilloscope 48. The X (horizontal axis) input receives a signal as generated by oscillator 23, which is proportional to the AC magnetic field $H_s \cos \omega_s t$. Thus, oscilloscope 48 displays the lock-in amplifier output (Y axis) as a function of $H_s \cos \omega_s t$ (X axis).

Figure 2:
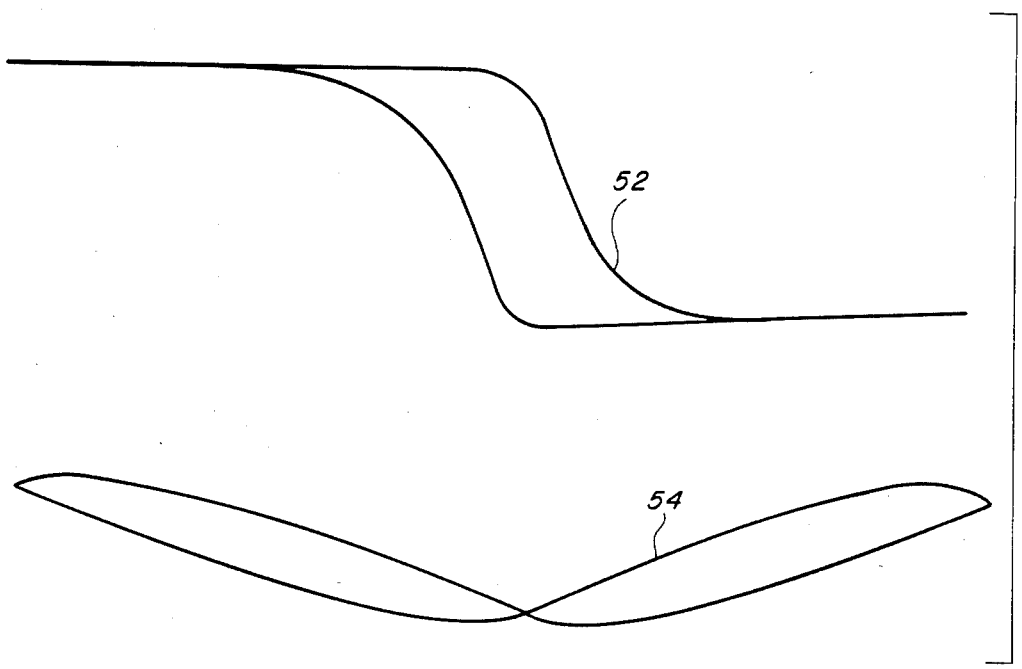
FIG. 2 is a representation of typical oscilloscope traces obtained with the FIG. 1 apparatus.

Referring now to FIG. 2, there are shown typical oscilloscope traces obtained with the above described apparatus. The hysteresis loop as shown at 52, hereafter referred to as a phase loop, results when a lock in amplifier phase output is coupled into oscilloscope 48. As can be seen from the Figure, the phase loop has wing tip ends. The section of loop 52 where the output level changes from one wing tip end to the other is the transition region. This region is where the total magnetic field H is zero or close to zero. The rounding of loop 52 in this region is due to the fact that the device electronics and senor material cannot instantaneously respond to input signals. A loop as shown at 54, hereafter referred to as an amplitude loop, is obtained when an amplitude output is used. When the device is exposed to a DC field, either the phase or amplitude loop will be laterally shifted on the oscilloscope display. Thus, by properly and conventionally calibrating the oscilloscope display, the amount of shift of either loop can be measured. The amount of shift or displacement is a measure of the strength of the external DC field.

In the above described illustrated embodiment, 3×3 coupler 24, detectors 26 and 28, and the various electronic components through integrator 44 constitute a passive phase detector wherein the phase of light transmitted through each arm are compared, and wherein an output signal is produced which is proportional to the phase shift. Such a passive phase detector system is described in detail in an article by K. P. Koo et al. entitled "Passive Stabilization Scheme for Fiber Interferometers using (3×3) Fiber Directional Couplers", Appl. Phys. Lett. 41(7), Oct. 1, 1982, pp. 616–618, whose disclosure is herein incorporated by reference. It should be understood that any detection scheme which accurately detects the phase shift in a sensing arm and produces an output proportional to the phase shift would be suitable according to the present invention. For example, a feedback system utilizing a phase compensator on the reference arm could be employed as one alternative. See U.S. Pat. No. 4,378,497 of Giallorenzi for a disclosure of such a feedback system.

A concrete example constructed according to the FIG. 1 embodiment will now be described. In this particular system, however, an active feedback system was employed rather than a passive system. The magnetostrictive element was excited with a large sawtooth magnetic field at a relatively low frequency $\omega_s$ of 0.2 Hz. A small sinusoidal magnetic field at a higher frequency $\omega_o = 1$ kHz was also imposed on the magnetostrictive element.

Figure 3:
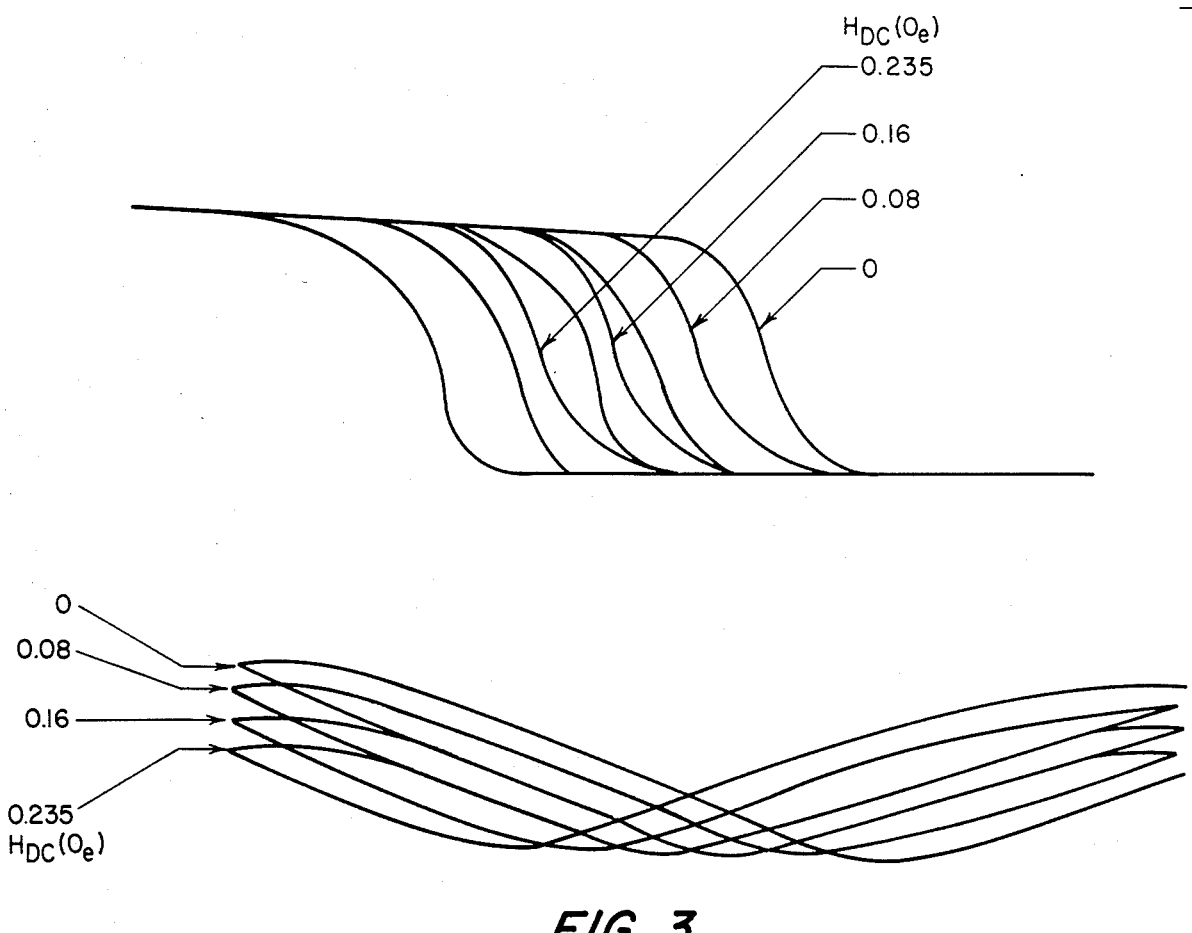
FIG. 3 is a representation of the above mentioned traces laterally shifted for several external DC magnetic field strengths.

Referring now to FIG. 3, results obtained with the above apparatus are shown for a set of external DC field strengths. The top traces are phase loops, and the bottom traces are amplitude loops.

It can be seen that the introduction of an external magnetic field causes a lateral shift of the location of the hysteresis loop of both the phase and amplitude outputs with reference to a fixed scanning magnetic field $H_s \cos \omega_s t$. Since the phase changes are more abrupt as a function of the scanned magnetic field, the phase output plots offer finer resolution and thus higher sensitivity than the amplitude output plots. However, the lateral shifts of the turning points or the vertical shifts of the "wing tips" of the hysteresis loop of the lock-in amplifier amplitude and phase outputs are also measures of the strengths of the external magnetic fields. In the phase output plots shown in FIG. 3, the width of each hysteresis loop is approximately equal to a lateral shift corresponding to the incremental external magnetic field being introduced.

The sensitivity of this detection scheme depends both on the magnetostrictive response of magnetic material and the maximum resolution of current drive to the magnetic coil. Since this detection scheme utilizes a sweeping technique, noise contribution is relevant only at the transition region of interest. The minimum detectable DC magnetic field of this particular fiber optic magnetic field sensor can be determined from the results shown in FIG. 3 and the minimum detectable optical phase shift of the interferometer. Using an experimentally achievable optical phase shift resolution of 1$\mu$ radian, a sample length of 5 cm and the lock-in amplifier signal outputs from FIG, 3, the minimum detectable magnetic field is $1.6 \times 10^{-6}$ Oe or $8 \times 10^{-8}$ Oe for 1 meter of sensing fiber.

In conclusion, a fiber optic magnetometer to measure magnetic fields without ambiguity due to material magnetic hysteresis has been described. Sensitivity in terms of minimum detectable DC magnetic field is on the order of $10^{-7}$ Oe for 1 meter of sensing fiber. This compares favorably with other room temperature magnetic field sensors since absolute sensitivity will increase directly with fiber length.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A fiber optic magnetometer for detecting DC magnetic fields comprising:
    a length of optical fiber having an optical length L in an unstrained condition;
    a light source means for transmitting a beam of light through said optical fiber, said light beam having a phase;
    magnetostrictive means closely associated with said fiber such that said magnetostrictive means undergoes a dimensional change in the presence of a magnetic field so as to strain said fiber causing a change in the optical length of said fiber and thus a shift in phase of said light beam;
    an AC field generating means for generating a first AC magnetic field having a frequency $\omega_o$ and a second AC magnetic field having a frequency $\omega_s$ different from $\omega_o$ in the vicinity of said magnetostrictive means so as to cause time varying dimensional changes in said magnetostrictive means, so that said phase shift is time varying, said phase shift being a sum of several frequency components including an $\omega_o$ component, an $(\omega_o + \omega_s)$ component, and an $(\omega_o - \omega_s)$ component;
    detection means for detecting said phase shift, wherein said phase shift changes in magnitude upon exposure of said magnetostrictive means to a DC magnetic field, the change in magnitude indicating the presence of a DC magnetic field.

2. A magnetometer as recited in claim 1 wherein said phase detection means further comprises: a signal producing means, said signal being proportional to said phase shift such that the signal also has several frequency components including $\omega_o$, $(\omega_o + \omega_s)$ and $(\omega_o - \omega_s)$ components; and a filter means for receiving the phase detector signal, said filter means filtering out all frequency components of the signal other than the $\omega_o$, $(\omega_o + \omega_s)$, and $(\omega_o - \omega_s)$ components so as to pass to its output only the $\omega_o$, $(\omega_o+\omega_s)$, and $(\omega_o-\omega_s)$ components.

3. A magnetometer as recited in claim 2 wherein said filter means is a lock-in amplifier set to amplify at $\omega_o$, and wherein $\omega_s$ is substantially less than $\omega_o$ such that said lock-in amplifier passes $(\omega_o+\omega_s)$ and $(\omega_o-\omega_s)$ components as well as the $\omega_o$ component.

4. A magnetometer as recited in claim 3 wherein said AC magnetic field generating means includes a wire coil in proximity to said magnetostrictive means, and a first AC current source for supplying an AC current of frequency $\omega_o$ to said coil, and a second AC current source for supplying an AC current of frequency $\omega_s$ to said coil.

5. A magnetometer as recited in claim 4, further comprising a display means for receiving a signal from said second AC current source, and also receiving an output signal from said lock-in amplifier, said display means displaying a plot of the lock-in amplifier output signal as a function of the second magnetic field, whereby a closed loop curve is displayed by said dsiplay means which shifts in position upon exposure of said magnetometer to a DC magnetic field.

6. A magnetometer as recited in claim 5 wherein $\omega_o$ is between 10 Hz and 1 KHz.

7. A magnetometer as recited in claim 5, wherein said phase detector means includes a second optical fiber equal in length to the other optical fiber, said second optical fiber also receiving a light beam from said light source means, wherein said phase detector means interferometrically detects the phase shift by comparing the phase of the beams transmitted through said optical fiber.

8. A magnetometer as recited in claim 7, wherein said display means is an oscilloscope.

9. A method of detecting DC magnetic fields comprising the steps of:
  providing a length of optical fiber having an optical length L in an unstrained condition;
  providing a magnetostrictive elements closely associated with said fiber such that said magnetostrictive element undergoes a dimensional change in the presence of a magnetic field so as to strain said fiber and cause a change in the optical length of said fiber and in the phase of said light beam;
  transmitting a beam of light having a phase through said optical fiber;
  generating a first AC magnetic field having a frequency $\omega_o$ and a second AC magnetic field having a frequency $\omega_s$ in the vicinity of said magnetostrictive element so as to cause dimensional changes in said magnetostrictive element, $\omega_o$ being difference from $\omega_s$ so that said phase shift is time varying, said phase shift being a sum of several frequency components including an $\omega_o$ component, an $(\omega_o+\omega_s)$ components, and an $(\omega_o-\omega_s)$ component;
  detecting said phase shift, which changes in magnitude upon exposure of said magnetostrictive element to a DC magnetic field, the change in magnitude indicating the presence of a DC magnetic field.

10. A fiber optic magnetometer for detecting DC magnetic fields comprising:
  a reference arm which includes a length of optical fiber;
  a sensing arm which includes a length of optical fiber equal in length to that of said reference arm, said sensing arm fiber having a magnetostrictive means closely associated therewith which undergoes a dimensional change in the presence of a magnetic field so as to change the optical length of said sensing arm;
  a light source means for transmitting a light beam through each said arm, whereby in the presence of a magnetic field the change in length of said sensing arm induces a phase shift in the beam transmitted therethrough;
  an AC magnetic field source which includes a wire coil in proximity to said magnetostrictive means, first AC current source for supplying an AC current of frequency $\omega_o$ to said coil, and a second AC current source for supplying an AC current of frequency $\omega_s$, $\omega_s$ being at least an order of magnitude less than $\omega_o$, whereby the AC magnetic fields produce a time-varying phase shift having several frequency components, including $\omega_o$, $(\omega_o+\omega_s)$, and $(\omega_o-\omega_s)$ components;
  interferometric phase detector means for detecting the time varying phase shift by comparing the phase of the beams transmitted through each fiber, said phase detector means producing a signal proportional to the detected phase shift such that the signal also has $\omega_o$, $(\omega_o+\omega_s)$ and $(\omega_o-\omega_s)$ components;
  a lock-in amplifier for receiving and amplifying the signal from said phase detector means at the frequency $\omega_o$ wherein frequency $\omega_s$ is sufficiently small such that said lock-in amplifier produces an output signal having $(\omega_o+\omega_s)$ and $(\omega_o-\omega_s)$ components as well as an $\omega_o$ component;
  a display means for receiving a signal from said second AC current source, and also receiving the output signal from said lock-in amplifier, said display means displaying a closed loop curve which is a plot of the lock-in amplifier output signal as a function of the second magnetic field, said closed loop curve shifts in position upon exposure of said magnetometer to a DC magnetic field.

* * * * *